United States Patent
Komo et al.

(10) Patent No.: US 10,505,518 B2
(45) Date of Patent: Dec. 10, 2019

(54) SEMICONDUCTOR DEVICE WITH SUBSTRATE TEMPERATURE MONITOR CIRCUIT

(71) Applicant: Mitsubishi Electric Corporation, Tokyo (JP)

(72) Inventors: Hideo Komo, Tokyo (JP); Koichi Taguchi, Fukuoka (JP); Takeshi Omaru, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 77 days.

(21) Appl. No.: 15/520,636

(22) PCT Filed: Jan. 20, 2015

(86) PCT No.: PCT/JP2015/051393
§ 371 (c)(1),
(2) Date: Apr. 20, 2017

(87) PCT Pub. No.: WO2016/117030
PCT Pub. Date: Jul. 28, 2016

(65) Prior Publication Data
US 2017/0317664 A1    Nov. 2, 2017

(51) Int. Cl.
*H03K 3/011*        (2006.01)
*G01K 3/10*         (2006.01)
(Continued)

(52) U.S. Cl.
CPC .............. *H03K 3/011* (2013.01); *G01K 3/10* (2013.01); *G01K 7/00* (2013.01); *G01K 7/01* (2013.01);
(Continued)

(58) Field of Classification Search
CPC ...... H03K 3/011; H03K 3/017; H01L 31/167; H01L 25/167; H01L 31/12; H01G 9/28;
(Continued)

(56) References Cited

U.S. PATENT DOCUMENTS 6,255,891 B1 *  7/2001  Matsuno .................. G01K 7/01
                                                327/512
6,851,849 B2 *  2/2005  Kimura ..................... G01J 1/44
                                                327/513
(Continued)

FOREIGN PATENT DOCUMENTS

CN        1701439 A       11/2005
CN        1881552 A       12/2006
(Continued)

OTHER PUBLICATIONS

An Office Action mailed by the State Intellectual Property Office of the People's Republic of China dated Jul. 3, 2018, which corresponds to Chinese Patent Application No. 201580074020.6 and is related to U.S. Appl. No. 15/520,636.
(Continued)

*Primary Examiner* — Jared Fureman
*Assistant Examiner* — Michael J Warmflash
(74) *Attorney, Agent, or Firm* — Studebaker & Brackett PC

(57) ABSTRACT

First and second circuits, a photocoupler and a substrate temperature monitor circuit are formed on a substrate. A photocoupler includes a primary-side light emitting diode that converts an electric signal received from the first circuit into an optical signal, and a light receiving device that converts the optical signal into an electric signal and outputs the electric signal to the second circuit. The substrate temperature monitor circuit reads a Vf voltage value of the
(Continued)

primary-side light emitting diode of the photocoupler to monitor temperature of the substrate.

7 Claims, 5 Drawing Sheets

(51) Int. Cl.
G01K 7/00 (2006.01)
H01L 31/12 (2006.01)
H03K 3/017 (2006.01)
G01K 7/01 (2006.01)
H01G 9/00 (2006.01)
H01G 9/28 (2006.01)
H01L 25/16 (2006.01)
H01L 31/167 (2006.01)

(52) U.S. Cl.
CPC ............ *H01G 9/0003* (2013.01); *H01G 9/28* (2013.01); *H01L 25/167* (2013.01); *H01L 31/12* (2013.01); *H01L 31/167* (2013.01); *H03K 3/017* (2013.01)

(58) Field of Classification Search
CPC .......... H01G 9/0003; G01K 3/10; G01K 7/00; G01K 7/01
See application file for complete search history.

(56) References Cited

U.S. PATENT DOCUMENTS

| 2003/0038332 | A1* | 2/2003 | Kimura | G01J 1/44 |
| | | | | 257/467 |
| 2005/0285228 | A1* | 12/2005 | Sugawara | H01L 23/045 |
| | | | | 257/584 |
| 2006/0284124 | A1* | 12/2006 | Aki | H01L 27/15 |
| | | | | 250/551 |
| 2013/0060499 | A1* | 3/2013 | Yoshimura | G01K 3/14 |
| | | | | 702/99 |
| 2016/0258821 | A1* | 9/2016 | Tsurumaru | G01K 7/01 |

FOREIGN PATENT DOCUMENTS

| CN | 102564627 A | | 7/2012 |
| CN | 102998017 A | | 3/2013 |
| JP | Sho62-218155 A | | 9/1987 |
| JP | 2004-310473 A | | 11/2004 |
| JP | 2005-268262 A | | 9/2005 |
| JP | 2005268262 A | * | 9/2005 |
| JP | 2006-351859 A | | 12/2006 |
| JP | 2007-201169 A | | 8/2007 |
| JP | 2008-306193 A | | 12/2008 |
| JP | 2012-023826 A | | 2/2012 |
| JP | 2012023826 A | * | 2/2012 |
| JP | 2013-053783 A | | 3/2013 |
| JP | 2013-130346 A | | 7/2013 |
| WO | 2013/065731 A1 | | 5/2013 |
| WO | 2013168104 A1 | | 11/2013 |

OTHER PUBLICATIONS

An Office Action; "Notification of Reasons for Refusal," mailed by the Japanese Patent Office dated Jan. 23, 2018, which corresponds to Japanese Patent Application No. 2016-570377 and is related to U.S. Appl. No. 15/520,636; with English language translation.
International Search Report issued in PCT/JP2015/051393; dated Mar. 10, 2015.
An Office Action mailed by the State Intellectual Property Office of People's Republic of China dated Mar. 27, 2019, which corresponds to Chinese Patent Application No. 201580074020.6 and is related to U.S. Appl. No. 15/520,636.
An Office Action mailed by the State Intellectual Property Office of People's Republic of China dated Oct. 22, 2019, which corresponds to Chinese Patent Application No. 201580074020.6 and is related to U.S. Appl. No. 15/520,636.

* cited by examiner

SEMICONDUCTOR DEVICE WITH SUBSTRATE TEMPERATURE MONITOR CIRCUIT

FIELD

The present invention relates to a semiconductor device capable of monitoring a substrate temperature without the need for adding any components.

BACKGROUND

A control system for a semiconductor device is required to achieve a high precision, a high functionality, and a high packaging density at a low cost. In the control system, an improvement in the precision of various sensing functions is one of important problems to be solved to achieve an improvement in the efficiency of the semiconductor device. One of impediments to the achievement of an improvement in precision is a variation in performance due to temperature characteristics of electronic components. Accordingly, it is necessary to take some measures to reduce the variation in performance.

Note that a photocoupler is an electronic component that is generally used to transmit signals from a logic part and a semiconductor device, while providing electrical isolation between the logic part and the semiconductor device. A technique in which a light emitting diode of a photocoupler detects abnormal heat generation in the photocoupler has been proposed (e.g., see PTL 1).

CITATION LIST

Patent Literature

[PTL 1] JP 2007-201169 A

SUMMARY

Technical Problem

To reduce a variation in performance of sensing functions due to temperature characteristics of electronic components, it is necessary to monitor the temperature of a substrate and feed back the monitored temperature. Accordingly, monitoring the substrate temperature using a thermocouple or a thermistor causes a problem that the number of components and costs increase.

The present invention has been made to solve the above-mentioned problem, and an object of the present invention is to obtain a semiconductor device capable of monitoring a substrate temperature without the need for adding any components.

Solution to Problem

A semiconductor device according to the present invention includes: a substrate; first and second circuits formed on the substrate; a photocoupler formed on the substrate and including a light emitting diode that converts an electric signal received from the first circuit into an optical signal, and a light receiving device that converts the optical signal into an electric signal and outputs the electric signal to the second circuit; and a substrate temperature monitor circuit reading a Vf voltage value of the light emitting diode of the photocoupler to monitor temperature of the substrate.

Advantageous Effects of Invention

In the present invention, the substrate temperature monitor circuit reads the Vf voltage value of the light emitting diode of the photocoupler to monitor the temperature of the substrate. Therefore, the photocoupler can monitor the temperature of the substrate, without the need for adding a component such as a thermocouple or a thermistor.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
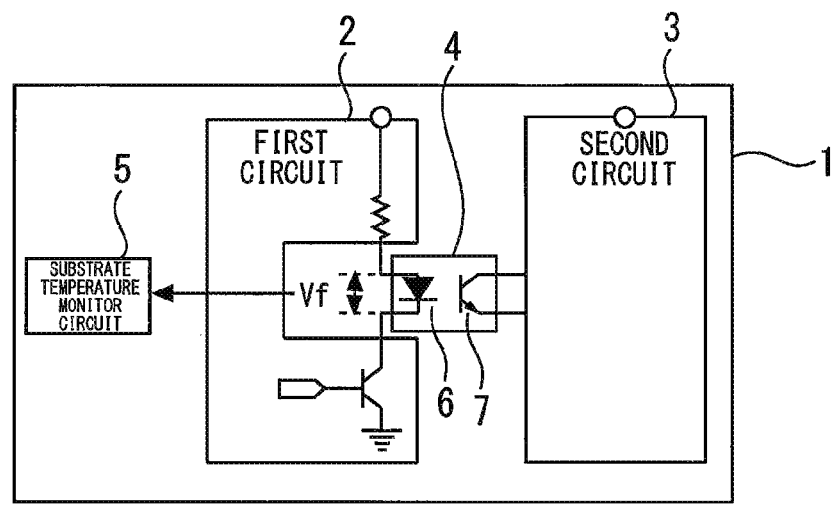
FIG. 1 is a diagram showing a semiconductor device according to Embodiment 1 of the present invention.

FIG. 1 is a diagram showing a semiconductor device according to Embodiment 1 of the present invention. On a substrate 1, first and second circuits 2 and 3, a photocoupler 4, and a substrate temperature monitor circuit 5 are formed. The photocoupler 4 includes a primary-side light emitting diode 6 that converts an electric signal received from the first circuit 2 into an optical signal, and a light receiving device 7 that converts the optical signal into an electric signal and outputs the electric signal to the second circuit 3. The photocoupler 4 transmits signals from the first circuit 2 and the second circuit 3, while providing electrical isolation between the first circuit 2 and the second circuit 3.

Figure 2:
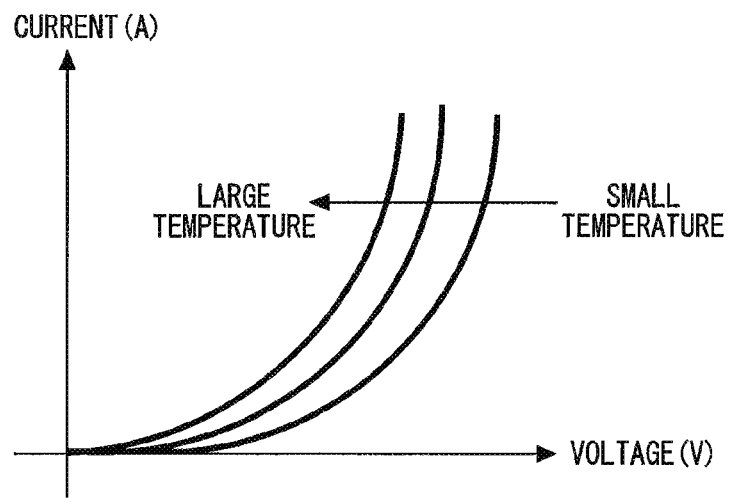
FIG. 2 is a graph showing Vf voltage characteristics of the light emitting diode of the photocoupler.

FIG. 2 is a graph showing Vf voltage characteristics of the light emitting diode of the photocoupler. As shown in the figure, the Vf voltage of the primary-side light emitting diode 6 has a temperature dependence. Accordingly, the substrate temperature monitor circuit 5 reads the Vf voltage value of the primary-side light emitting diode 6 of the photocoupler 4, thereby monitoring the temperature of the substrate 1. Since the photocoupler 4 is originally equipped in the device, the photocoupler 4 can monitor the temperature of the substrate 1, without the need for adding a component such as a thermocouple or a thermistor. The monitored temperature is fed back to various sensing circuits to cancel a variation in circuit characteristics due to the temperature, thereby achieving an improvement in the precision of sensing functions.

Embodiment 2

Figure 3:
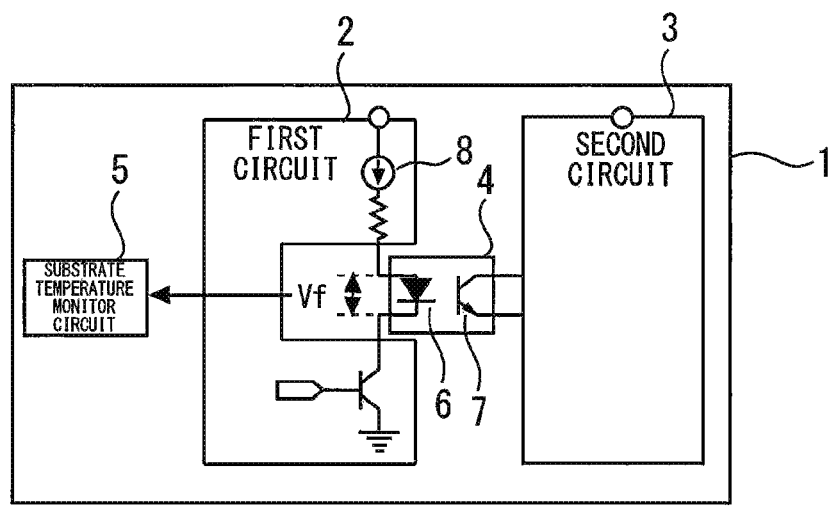
FIG. 3 is a diagram showing a semiconductor device according to Embodiment 2 of the present invention.

FIG. 3 is a diagram showing a semiconductor device according to Embodiment 2 of the present invention. A constant current circuit 8 is used as a drive circuit for the primary-side light emitting diode 6. With this configuration, substrate temperature information can be accurately monitored.

Embodiment 3

Figure 4:
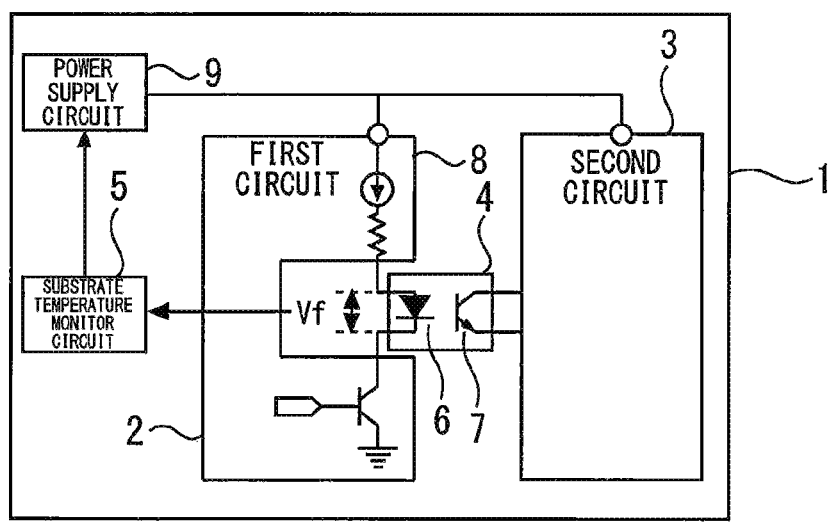
FIG. 4 is a diagram showing a semiconductor device according to Embodiment 3 of the present invention.

FIG. 4 is a diagram showing a semiconductor device according to Embodiment 3 of the present invention. A power supply circuit 9 supplies a voltage to each of the first and second circuits 2 and 3. The substrate temperature monitor circuit 5 corrects a temperature variation in the output voltage value of the power supply circuit 9 according to the monitored temperature of the substrate 1. Thus, the temperature information is fed back to the power supply circuit 9 and a variation in the power supply voltage value due to temperature characteristics is corrected, thereby making it possible to improve the precision of the drive system for the semiconductor device.

Embodiment 4

Figure 5:
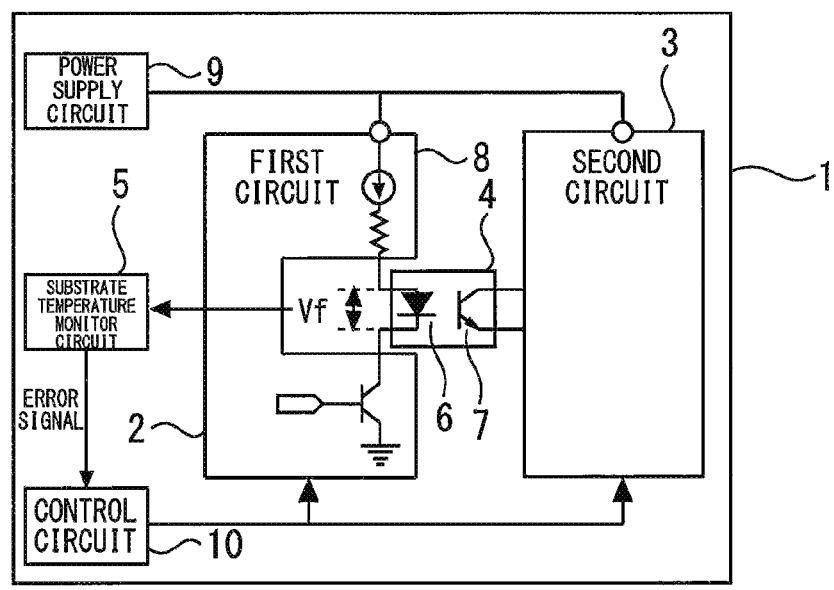
FIG. 5 is a diagram showing a semiconductor device according to Embodiment 4 of the present invention.

FIG. 5 is a diagram showing a semiconductor device according to Embodiment 4 of the present invention. The substrate temperature monitor circuit 5 outputs an error signal when the monitored temperature of the substrate 1 has reached a threshold. A control circuit 10 which has received the error signal interrupts the operation of each of the first and second circuits 2 and 3. Thus, the error signal is output during abnormal heat generation in the substrate 1, thereby making it possible to properly protect the semiconductor device.

Embodiment 5

Figure 6:
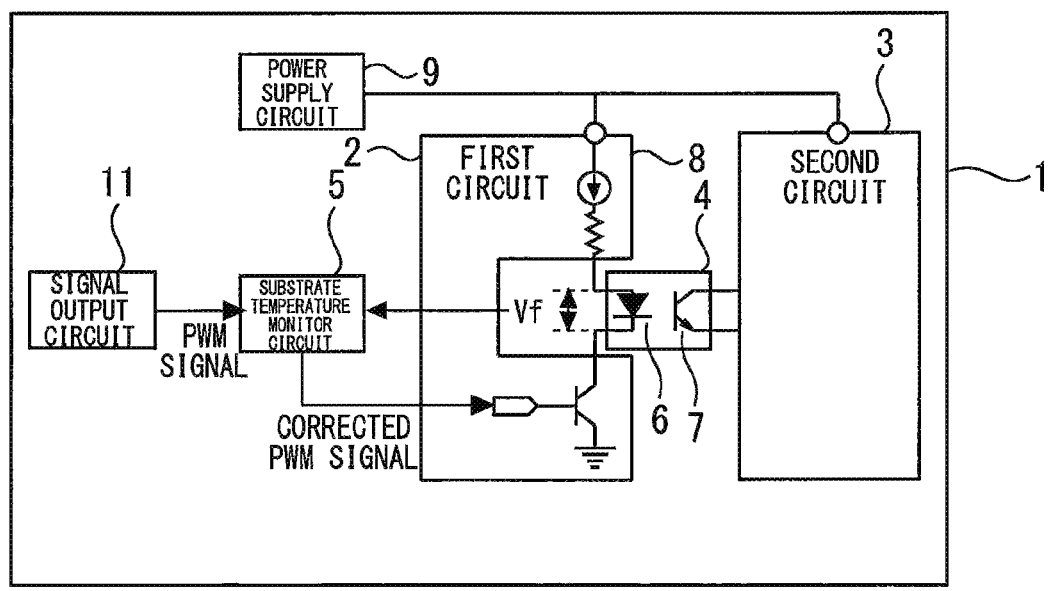
FIG. 6 is a diagram showing a semiconductor device according to Embodiment 5 of the present invention.

FIG. 6 is a diagram showing a semiconductor device according to Embodiment 5 of the present invention. A signal output circuit 11 outputs a pulse width modulation (PWM) signal. The substrate temperature monitor circuit 5 corrects a PWM signal according to the monitored temperature of the substrate 1 and supplies the PWM signal to the photocoupler 4. Thus, the temperature is monitored by the substrate temperature monitor circuit 5 and the monitored temperature is fed back, thereby making it possible to correct a variation in transmission of a duty of the PWM signal of the photocoupler 4 that is caused due to temperature characteristics.

Embodiment 6

Figure 7:
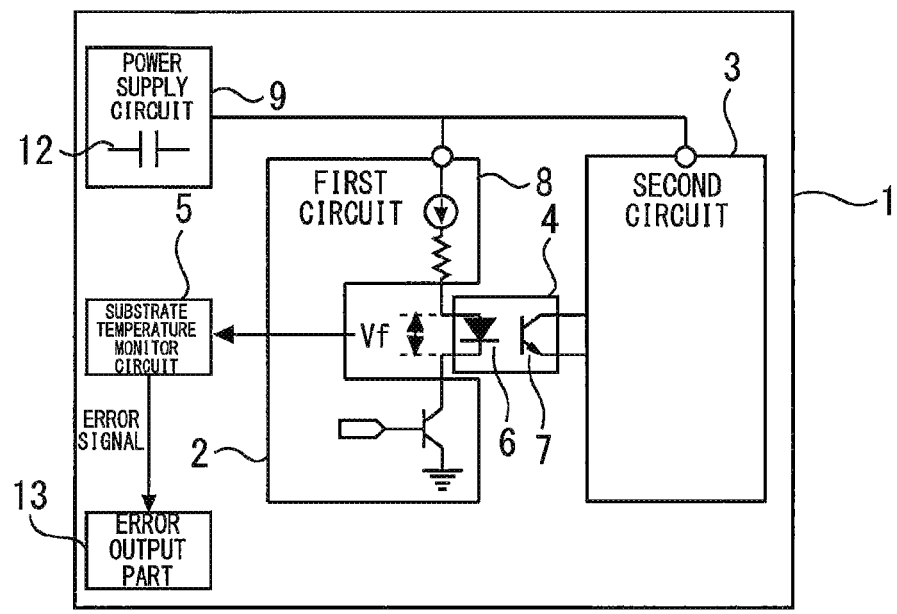
FIG. 7 is a diagram showing a semiconductor device according to Embodiment 6 of the present invention.
Figure 8:
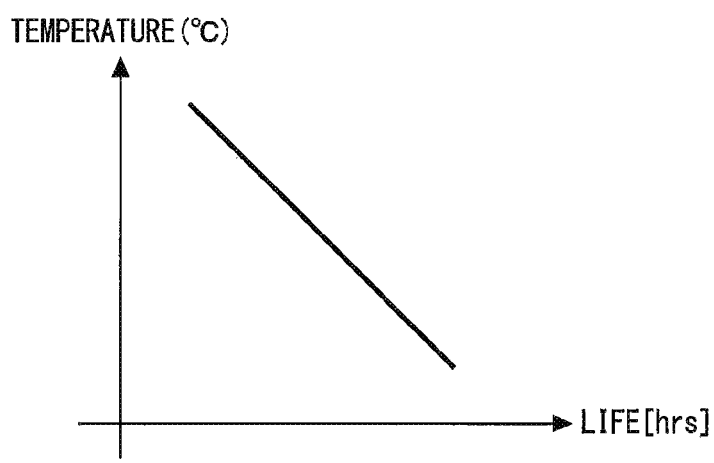
FIG. 8 is a graph showing a life curve of the aluminum electrolytic capacitor.

FIG. 7 is a diagram showing a semiconductor device according to Embodiment 6 of the present invention. The power supply circuit 9 includes an aluminum electrolytic capacitor 12. The substrate temperature monitor circuit 5 refers to a preliminarily stored life curve of the aluminum electrolytic capacitor 12, and accumulates thermal histories of the aluminum electrolytic capacitor 12 from the monitored temperature of the substrate 1, to thereby predict the life of the aluminum electrolytic capacitor 12. FIG. 8 is a graph showing a life curve of the aluminum electrolytic capacitor. Based on this life curve, the life of the aluminum electrolytic capacitor 12 can be accurately predicted.

The substrate temperature monitor circuit 5 outputs an error signal when the predicted life of the aluminum electrolytic capacitor 12 has reached life criteria. An error output part 13 which has received the error signal notifies a user of the error by display, voice, or the like. Thus, the semiconductor device can be properly protected, and a time for replacement of the semiconductor device can be detected.

Embodiment 7

Figure 9:
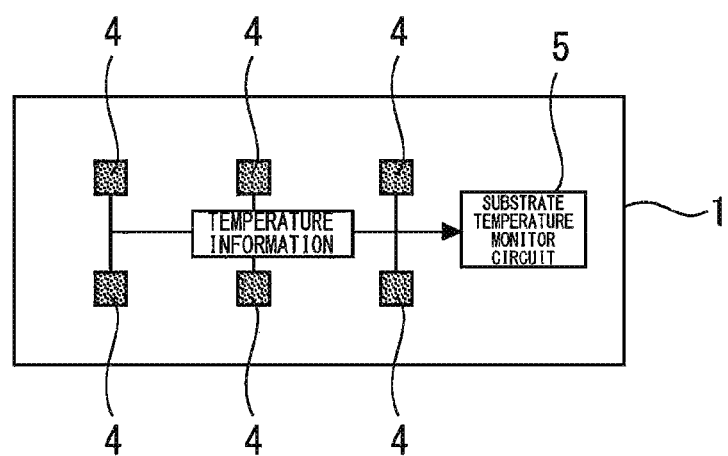
FIG. 9 is a diagram showing a semiconductor device according to Embodiment 7 of the present invention.

FIG. 9 is a diagram showing a semiconductor device according to Embodiment 7 of the present invention. A plurality of photocouplers 4 is formed on the substrate 1. Although the illustration of the first and second circuits 2 and 3 and the like is omitted, the configurations of these components are similar to those of any one of Embodiments 1 to 6.

The substrate temperature monitor circuit 5 reads the Vf voltage value of the primary-side light emitting diode 6 of each of the plurality of photocouplers 4, and averages the read voltage values, thereby monitoring the temperature of the substrate 1. Thus, the temperature of the substrate is monitored by the plurality of photocouplers 4, thereby making it possible to more accurately monitor the temperature of the substrate 1.

Embodiment 8

Figure 10:
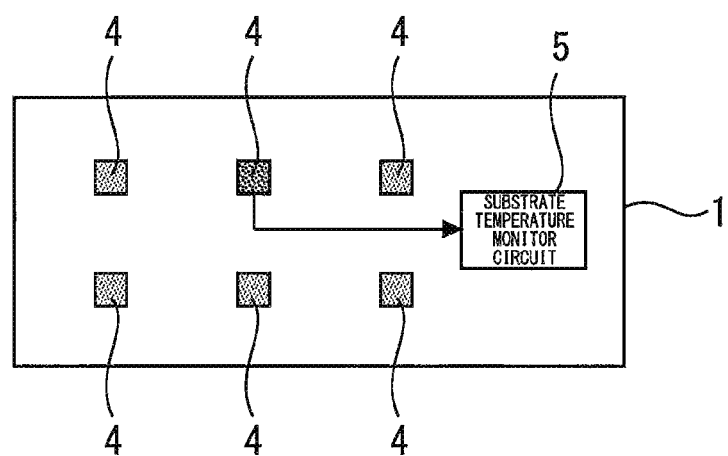
FIG. 10 is a diagram showing a semiconductor device according to Embodiment 8 of the present invention.

FIG. 10 is a diagram showing a semiconductor device according to Embodiment 8 of the present invention. A plurality of photocouplers 4 is formed on the substrate 1. Although the illustration of the first and second circuits 2 and 3 and the like is omitted, the configurations of these components are similar to those of any one of Embodiments 1 to 6.

The substrate temperature monitor circuit 5 reads the Vf voltage value of the primary-side light emitting diode 6 of the photocoupler 4 that is located at a position where the temperature of the substrate 1 is highest among the plurality of photocouplers 4, thereby monitoring the temperature of the substrate 1. Thus, one of the photocouplers 4 is monitored, thereby minimizing the cost and sensing processing.

REFERENCE SIGNS LIST 1 substrate; 2 first circuit; 3 second circuit; 4 photocoupler; 5 substrate temperature monitor circuit; 6 primary-side light emitting diode; 7 light receiving device; 8 constant current circuit; 9 power supply circuit; 10 control circuit; 11 signal output circuit; 12 aluminum electrolytic capacitor

The invention claimed is:

1. A semiconductor device comprising:
a substrate;
first and second circuits formed on the substrate;
a photocoupler formed on the substrate and including a light emitting diode that converts an electric signal received from the first circuit into an optical signal, and a light receiving device that converts the optical signal into an electric signal and outputs the electric signal to the second circuit;
a substrate temperature monitor circuit reading a Vf voltage value of the light emitting diode of the photocoupler to monitor temperature of the substrate; and a power supply circuit supplying a voltage to each of the first and second circuits, wherein the substrate temperature monitor circuit corrects a temperature variation in an output voltage value of the power supply circuit according to the monitored temperature of the substrate.

2. The semiconductor device according to claim 1, wherein the power supply circuit is a single power supply circuit that supplies the voltage to each of the first and second circuits in parallel.

3. A semiconductor device comprising:

a substrate;

first and second circuits formed on the substrate;

a photocoupler formed on the substrate and including a light emitting diode that converts an electric signal received from the first circuit into an optical signal, and a light receiving device that converts the optical signal into an electric signal and outputs the electric signal to the second circuit;

a substrate temperature monitor circuit reading a Vf voltage value of the light emitting diode of the photocoupler to monitor temperature of the substrate; and a power supply circuit supplying a voltage to each of the first and second circuits, wherein the power supply circuit includes an aluminum electrolytic capacitor, and the substrate temperature monitor circuit accumulates thermal histories of the aluminum electrolytic capacitor from the monitored temperature of the substrate to predict a life of the aluminum electrolytic capacitor.

4. The semiconductor device according to claim 3, wherein the substrate temperature monitor circuit outputs an error signal when the predicted life of the aluminum electrolytic capacitor has reached life criteria.

5. The semiconductor device according to claim 3, wherein the power supply circuit is a single power supply circuit that supplies the voltage to each of the first and second circuits in parallel.

6. A semiconductor device comprising:

a substrate;

first and second circuits formed on the substrate;

a photocoupler formed on the substrate and including a light emitting diode that converts an electric signal received from the first circuit into an optical signal, and a light receiving device that converts the optical signal into an electric signal and outputs the electric signal to the second circuit; and a substrate temperature monitor circuit reading a Vf voltage value of the light emitting diode of the photocoupler to monitor temperature of the substrate, wherein the photocoupler includes a plurality of photocouplers, and the substrate temperature monitor circuit reads the Vf voltage value of the light emitting diode of each of the plurality of photocouplers and averages the read voltage values to monitor the temperature of the substrate.

7. The semiconductor device according to claim 6, wherein the plurality of photocouplers are each formed on the same substrate.

* * * * *